(12) United States Patent
Nomura

(10) Patent No.: US 7,678,513 B2
(45) Date of Patent: Mar. 16, 2010

(54) PHOTO MASK, FOCUS MEASURING METHOD USING THE MASK, AND METHOD OF MANUFACTURING SEMICONDUCTOR DEVICE

(75) Inventor: Hiroshi Nomura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/496,585

(22) Filed: Jul. 1, 2009

(65) Prior Publication Data

US 2009/0263733 A1 Oct. 22, 2009

Related U.S. Application Data

(63) Continuation of application No. 11/187,997, filed on Jul. 25, 2005, now abandoned.

(30) Foreign Application Priority Data

Jul. 26, 2004 (JP) .............................. 2004-217874

(51) Int. Cl.
G03F 1/00 (2006.01)
(52) U.S. Cl. ............................................. 430/5; 355/55
(58) Field of Classification Search ...................... 430/5, 430/30; 355/55; 356/124; 257/797
See application file for complete search history.

(56) References Cited

U.S. PATENT DOCUMENTS

| | | | |
|---|---|---|---|
| 5,789,118 | A | 8/1998 | Liu et al. |
| 6,171,739 | B1 | 1/2001 | Spence et al. |
| 6,674,511 | B2 | 1/2004 | Nomura et al. |
| 6,710,853 | B1 | 3/2004 | La Fontaine et al. |
| 6,940,585 | B2 * | 9/2005 | Nomura et al. ................ 355/55 |
| 7,432,021 | B2 * | 10/2008 | Sato et al. ........................ 430/5 |

(Continued)

FOREIGN PATENT DOCUMENTS

JP 2002-055435 2/2002

(Continued)

OTHER PUBLICATIONS

European Search Report issued by the European Patent Office, dated Aug. 31, 2005, for European Patent Application No. 05016078.Jul. 2222 PCT.

(Continued)

*Primary Examiner*—Mark F Huff
*Assistant Examiner*—Stewart A Fraser
(74) *Attorney, Agent, or Firm*—Finnegan, Henderson, Farabow, Garrett & Dunner, L.L.P.

(57) ABSTRACT

A photo mask includes an asymmetrical diffraction grating pattern in which diffraction efficiencies of plus primary diffracted light and minus primary diffracted light are different, the asymmetrical diffraction grating pattern including a shielding portion which shields light, a first transmitting portion which transmits light, and a second transmitting portion which transmits light, a ratio of widths of the shielding portion, the first transmitting portion, and the second transmitting portion being n11 where n is a positive real number except 2, the asymmetrical diffraction grating pattern approximately satisfying $163° \leq 360°/(n+2)+\theta \leq 197°$ where $\theta$ ($\neq 90°$) indicates an absolute value of a difference between a phase of the light transmitted through the first transmitting portion and that of the light transmitted through the second transmitting portion, and a reference pattern for obtaining an image as a reference for measuring a shift of an image of the asymmetrical diffraction grating pattern.

10 Claims, 12 Drawing Sheets

U.S. PATENT DOCUMENTS

| | | | |
|---|---|---|---|
| 7,482,102 B2 * | 1/2009 | Sato et al. ................... 430/5 |
| 2002/0021434 A1 | 2/2002 | Nomura et al. |
| 2003/0020901 A1 | 1/2003 | Kunkel et al. |
| 2003/0123052 A1 | 7/2003 | Ausschnitt et al. |

FOREIGN PATENT DOCUMENTS

| | | |
|---|---|---|
| JP | 3297423 | 4/2002 |
| JP | 2004-029372 | 1/2004 |
| WO | WO 03/042629 A1 | 5/2003 |

OTHER PUBLICATIONS

Notice of Reasons for Rejection mailed Nov. 24, 2009, in corresponding Japanese Patent Application No. 2004-217874 and English-language translation thereof.

* cited by examiner

PHOTO MASK, FOCUS MEASURING METHOD USING THE MASK, AND METHOD OF MANUFACTURING SEMICONDUCTOR DEVICE

CROSS-REFERENCE TO RELATED APPLICATIONS

This application is a continuation of U.S. application Ser. No. 11/187,997, filed July 25, 2005 now abandoned, which is based upon and claims the benefit of priority from the prior Japanese Patent Application No. 2004-217874, filed July 26, 2004. The entire contents of these applications are incorporated herein by reference in their entirety.

BACKGROUND OF THE INVENTION

1. Field of the Invention

The present invention relates to a photo mask for use in a semiconductor field, a focus measuring method using the mask, and a method of manufacturing a semiconductor device.

2. Description of the Related Art

A tolerance of focus permitted in lithography has been narrowed as a design rule of a semiconductor device to be manufactured is miniaturized. When the tolerance of the focus is narrowed, flatness of a wafer and specifications with respect to curvature of field of an exposure apparatus has been strict. Moreover, a high-precision measuring method of the focus, curvature of field and the like using a resist pattern transferred onto the wafer has become important.

A focus test mask comprising an asymmetrical diffraction grating pattern and a reference pattern, and a focus measuring method using the focus test mask and utilizing a phenomenon in which an image of the asymmetrical diffraction grating pattern shifts in proportion to a focus value have been known (Jpn. Pat. No. 3297423). Since the focus measuring method has a high measurement precision having a measurement error of 5 nm or less, and the measuring is simple, the method can be said to be one of most promising techniques at present.

The asymmetrical diffraction grating pattern comprises a shielding portion, a transmitting portion, and 90° phase grooved portion. A line width ratio of the shielding portion, transmitting portion, and 90° phase grooved portion is ideally 2:1:1. On the other hand, an alternating type phase shift exposure mask including a pattern (device pattern) for manufacturing an actual semiconductor product comprises a 180° phase grooved portion.

A method of manufacturing an exposure mask comprising the asymmetrical diffraction grating pattern and the device pattern includes a step of forming the 90° phase grooved portion, and a step of forming the 180° phase grooved portion. When these two steps are performed, a manufacturing process is complicated, and manufacturing costs remarkably rise. This respect will be further described hereinafter.

The step of forming the 180° phase grooved portion includes a step of forming a trench vertically in the surface of a quartz glass substrate by a dry process (e.g., a vertical etching process such as an RIE process); and a step of expanding the trench by predetermined amounts in a lateral direction and a vertical direction by a wet process (isotropic etching process). A sum of grooved amounts by the dry and wet processes is a grooved amount by which a phase of transmitted light delays by 180° as compared with a case where there is not any grooved portion.

To obtain a high-precision alternating type phase shift exposure mask, the groove has to be made vertically, and further expanded in the lateral direction. However, an etching process to expand the groove only in the lateral direction does not exist. Therefore, as described above, combined use of the dry and wet processes is required. Since an amount to be expanded in the lateral direction needs to be controlled with a high precision, the grooved amount in the dry process is a depth obtained by subtracting the amount to be expanded in the lateral direction from the amount corresponding to 180°. On the other hand, to obtain a high-precision focus test mask, a grooved portion corresponding to 90° has to be formed only by the dry process.

Therefore, in a conventional technique, the above-described etching processes have to be separately performed in order to realize the high-precision alternating type phase shift exposure mask and the high-precision focus test mask in one exposure mask, and a mask manufacturing cost rises by at least 30% or more as compared with the conventional alternating type phase shift exposure mask.

BRIEF SUMMARY OF THE INVENTION

According to an aspect of the present invention, there is provided a photo mask comprising: an asymmetrical diffraction grating pattern in which diffraction efficiencies of plus primary diffracted light and minus primary diffracted light are different, the asymmetrical diffraction grating pattern including a shielding portion which shields light; a first transmitting portion which transmits light; and a second transmitting portion which transmits light, a ratio of widths of the shielding portion, the first transmitting portion, and the second transmitting portion being n:1:1 where n is a positive real number except 2, the asymmetrical diffraction grating pattern approximately satisfying $163° \leq 360°/(n+2)+\theta \leq 197°$ where $\theta$ ($\neq 90°$) indicates an absolute value of a difference between a phase of the light transmitted through the first transmitting portion and that of the light transmitted through the second transmitting portion; and a reference pattern configured to obtain an image as a reference for measuring a shift of an image of the asymmetrical diffraction grating pattern.

According to an aspect of the present invention, there is provided a focus measuring method comprising: preparing a focus test mask, the focus test mask comprising: an asymmetrical diffraction grating pattern in which diffraction efficiencies of plus primary diffracted light and minus primary diffracted light are different, the asymmetrical diffraction grating pattern including a shielding portion which shields light, a first transmitting portion which transmits light, and a second transmitting portion which transmits light, a ratio of widths of the shielding portion, the first transmitting portion, and the second transmitting portion being n:1:1 where n is a positive real number except 2, the asymmetrical diffraction grating pattern approximately satisfying $163° \leq 360°/(n+2)+\theta \leq 197°$ where $\theta$ ($\neq 90°$) indicates an absolute value of a difference between a phase of the light transmitted through the first transmitting portion and that of the light transmitted through the second transmitting portion; and a reference pattern configured to obtain an image as a reference for measuring a shift of an image of the asymmetrical diffraction grating pattern; applying a photosensitive agent on the substrate; exposing images of the asymmetrical diffraction grating pattern and the reference pattern in the photo mask at the same time onto the substrate; developing a pattern transferred on the substrate; and measuring a relative distance between the images of the asymmetrical diffraction grating pattern and the reference pattern formed on the substrate.

According to an aspect of the present invention, there is provided a method of manufacturing a semiconductor device comprising: preparing an exposure mask, the exposure mask comprising an asymmetrical diffraction grating pattern in which diffraction efficiencies of plus primary diffracted light and minus primary diffracted light are different, the asymmetrical diffraction grating pattern including a shielding portion which shields light, a first transmitting portion which transmits light, and a second transmitting portion which transmits light, a ratio of widths of the shielding portion, the first transmitting portion, and the second transmitting portion being n:1:1 where n is a positive real number except 2, the asymmetrical diffraction grating pattern approximately satisfying $163° \leq 360°/(n+2)+\theta \leq 197°$ where $\theta$ ($\neq 90°$) indicates an absolute value of a difference between a phase of the light transmitted through the first transmitting portion and that of the light transmitted through the second transmitting portion; a reference pattern configured to obtain an image which is a reference in measuring a shift of an image of the asymmetrical diffraction grating pattern; and a device pattern; applying a photosensitive agent on the substrate; exposing images of the asymmetrical diffraction grating pattern, the reference pattern, and the device pattern in the photo mask at the same time onto the substrate; developing a pattern transferred on the substrate; inspecting the device pattern formed on the substrate; and measuring a relative distance between the images of the asymmetrical diffraction grating pattern and the reference pattern in a case where a defect is detected in the device pattern in the inspecting the device pattern formed on the substrate.

DETAILED DESCRIPTION OF THE INVENTION

Hereinafter, embodiments of the present invention will be described with reference to the accompanying drawings.

Figure 1:
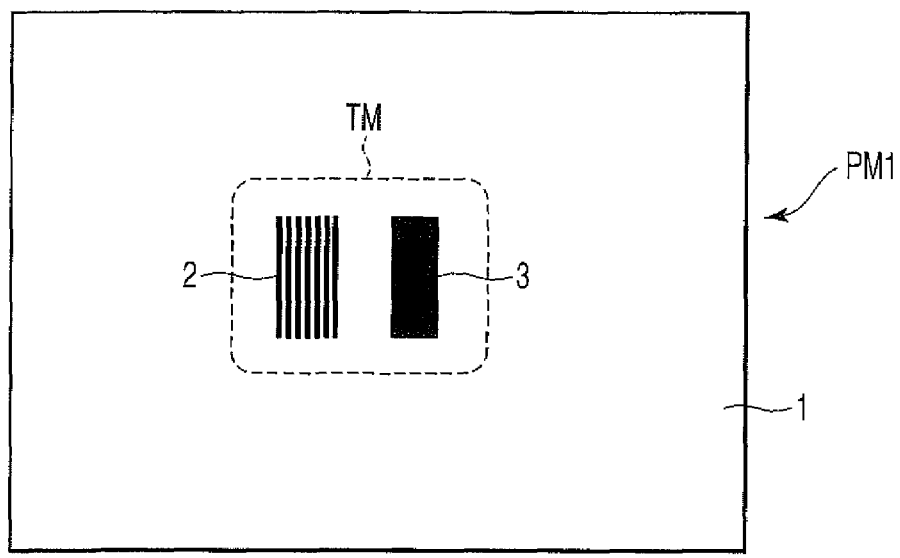
FIG. 1 is a plan view schematically showing a photo mask (focus test mask) of an embodiment.
Figure 2:
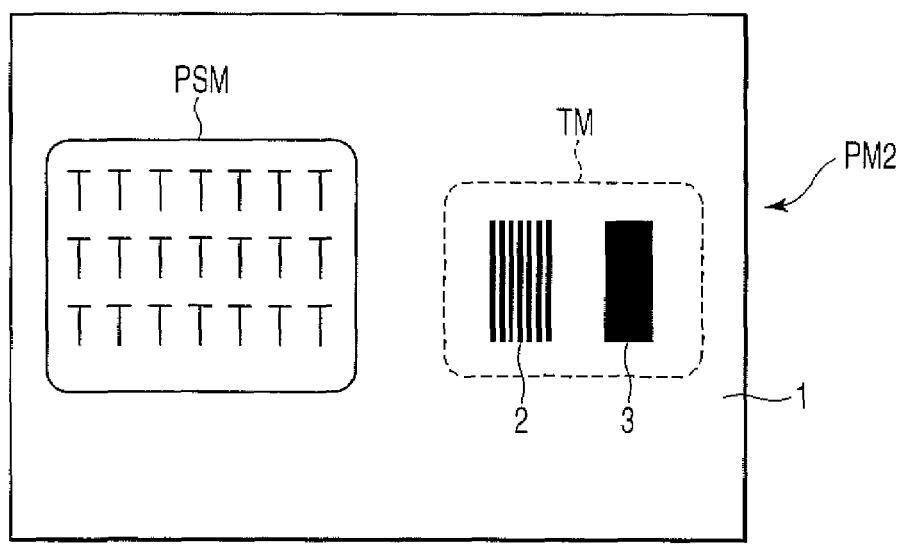
FIG. 2 is a plan view schematically showing another photo mask (exposure mask) of the embodiment.

FIGS. 1 and 2 are plan views schematically showing a photo mask of the embodiment. Concretely, FIG. 1 shows an example of a focus test mask PM1, and FIG. 2 shows an example of an exposure mask PM2.

The focus test mask PM1 comprises a quartz glass substrate 1, and a test mark TM for focus measurement, provided on the quartz glass substrate 1.

The exposure mask PM2 comprises the quartz glass substrate 1, the test mark TM provided on the quartz glass substrate 1, and an alternating type phase shift mask PSM provided on the quartz glass substrate 1 and including a pattern (device pattern) for manufacturing an actual semiconductor product. The phase shift mask PSM comprises a shielding portion, and first and second transmitting portions (phase grooved portions). An absolute value of a difference between phases of lights transmitted through the first and second transmitting portions is 180°.

Each of the test marks TM in the focus test masks PM1, PM2 comprises an asymmetrical diffraction grating pattern (hereinafter referred to as the PSG pattern) 2 including a periodic pattern which differs in diffraction efficiency with plus and minus primary diffracted lights, and a reference pattern 3.

Figure 3:
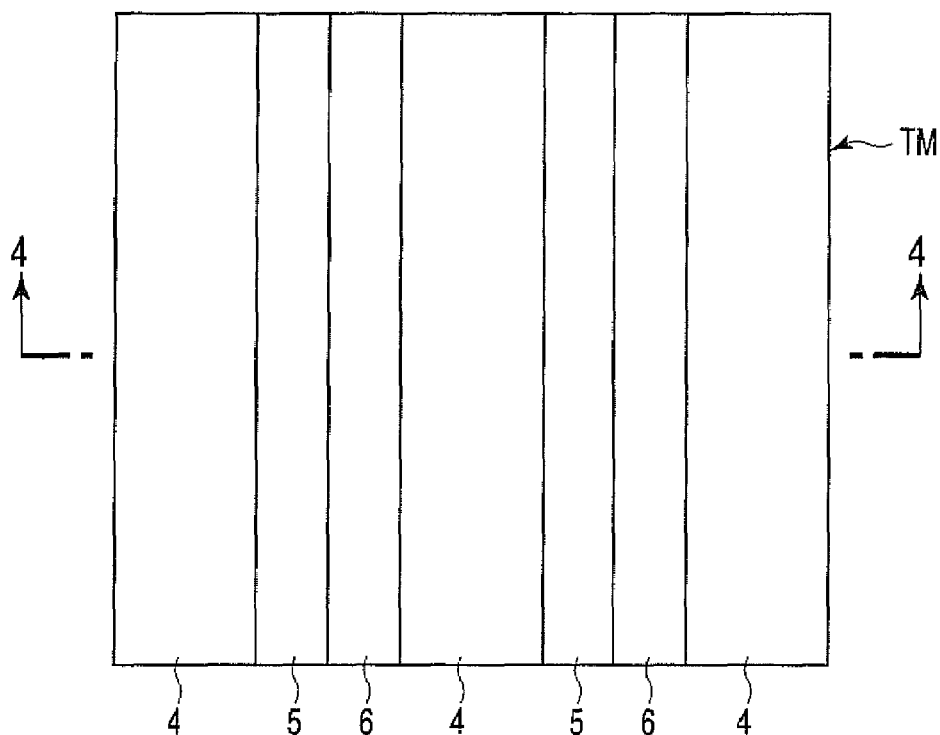
FIG. 3 is a plan view showing details of a test mask of the embodiment.
Figure 4:
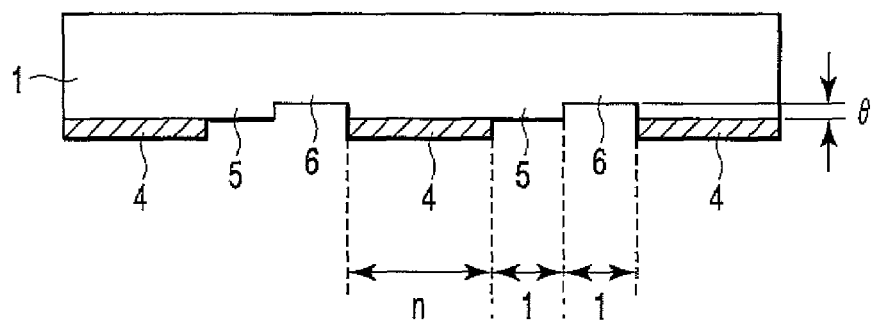
FIG. 4 is a sectional view along arrows A-A' of FIG. 3.

FIG. 3 is a plan view showing details of the PSG pattern 2. FIG. 4 is a sectional view along arrows A-A' of FIG. 3.

The PSG pattern 2 comprises shielding portions 4 which are provided on the glass substrate 1 and shield the light; the first transmitting portions 5 which are provided on the glass substrate 1 and transmit the light; and the second transmitting portions 6 (phase grooved portions) which are provided on the glass substrate 1 and transmit the light.

The shielding portion 4, the first transmitting portion 5, and the second transmitting portion 6 satisfy the following two equations ([1], [2]).

$$W1:W2:W3=n:1:1 \qquad \text{[Equation 1]}$$

$$163° \leq 360°/(n+2)+\theta \leq 197° \qquad \text{[Equation 2]}$$

W1 ... width of the shielding portion 4
W2 ... width of the first transmitting portion 5
W3 ... width of the second transmitting portion 6
n ... positive real number other than 2
$\theta$ ... absolute value of the difference between the phase of the light transmitted through the first transmitting portion 5 and that of the light transmitted through the second transmitting portion 6. Additionally, 90° is excluded.

FIGS. 5A to 5H are sectional views showing a method of manufacturing the exposure mask PM2. A left side of a one-dot chain line shows a region (PSG region) occupied by the PSG pattern 2 in the mask, and a right side of the one-dot chain line shows a region (alternating PSM region) occupied by the phase shift mask PSM in the mask.

Figure 5A:
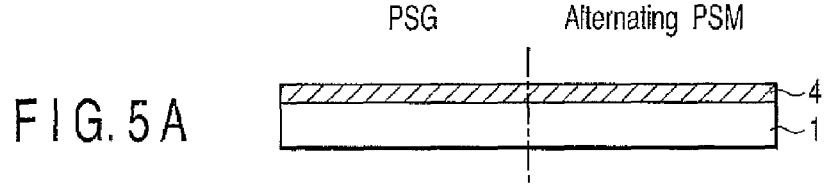
FIGS. 5A to 5H are sectional views showing a method of manufacturing the exposure mask of the embodiment.

First, as shown in FIG. 5A, a chromium film (shielding film) 4 to be processed into the shielding portion is formed on the quartz glass substrate 1.

Figure 5B:
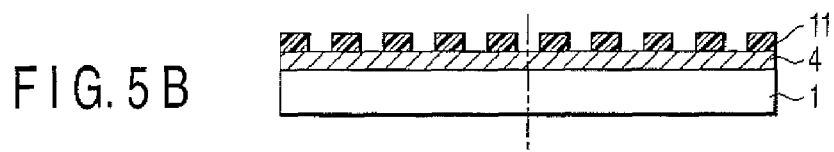

Next, as shown in FIG. 5B, a resist film is formed on the chromium film 4, and thereafter exposing and developing are performed with respect to the resist film to form a resist pattern 11. The resist pattern 11 forms shielding portions in a PSG region and alternating PSM region. The resist film is exposed, for example, by EB drawing.

Figure 5C:
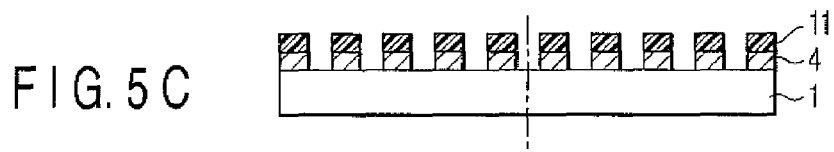

Next, as shown in FIG. 5C, the chromium film 4 is etched using the resist pattern 11 a mask. As a result, the shielding portions 4 comprising chromium are formed in the PSG region and alternating PSM region. Thereafter, the resist pattern 11 is removed.

In the present embodiment, a step of forming the resist pattern for forming the shielding portion 4 in the PSG region, and a step of forming the resist pattern for forming the shielding portion in the alternating PSM region are simultaneously performed in the step of FIG. 5B. Furthermore, an etching step for forming the shielding portion 4 in the PSG region, and an etching step for forming the shielding portion in the alternating PSM region are simultaneously performed in the step of FIG. 5C. Therefore, a manufacturing process of the exposure mask PM2 of the present embodiment is not changed as compared with the manufacturing process of a phase shift mask of a conventional alternating type.

It is to be noted that the step of forming the resist pattern for forming the shielding portion 4 in the PSG region, and the step of forming the resist pattern for forming the shielding portion in the alternating PSM region may be performed in separate steps, and the etching step for forming the shielding portion 4 in the PSG region and the etching step for forming the shielding portion in the alternating PSM region may be performed in separate steps.

In this case, the process of forming the shielding portion 4 in the PSG region, and the process of forming the shielding portion in the alternating PSM region can be easily optimized. For example, the step of forming the resist pattern for forming the shielding portion 4 in the PSG region may be performed using a photo repeater which is a apparatus having a higher alignment precision as compared with an EB exposure apparatus.

Figure 5D:
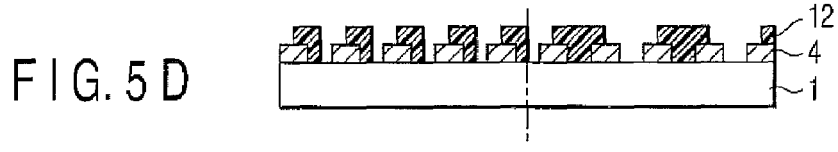

Next, as shown in FIG. 5D, a resist pattern 12 is formed on the shielding portions 4 and quartz glass substrate 1. The resist pattern 12 forms the first and second transmitting portions (phase grooved portions) in the PSG and alternating PSM regions.

Figure 5E:
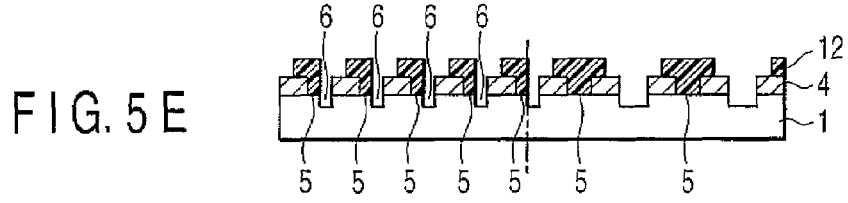

Next, as shown in FIG. 5E, the surface of the quartz glass substrate 1 is etched by an RIE process (dry process) using the resist pattern 12 as a mask. As a result, a plurality of grooved portions (trenches) are formed in the surface of the quartz glass substrate 1. These grooved portions have substantially vertical side walls. FIG. 5E shows seven grooved portions. Thereafter, the resist pattern 12 is removed.

Among the plurality of grooved portions, the grooved portions in the PSG region form the second transmitting portions 6. Among the plurality of grooved portions, the grooved portions in the alternating PSM region form the second transmitting portions through a wet process of FIG. 5G.

Moreover, portions in which any shielding portion 4 is not formed and any grooved portion is not formed form the first transmitting portions 5 in the PSG region and the alternating PSM region.

Figure 5F:
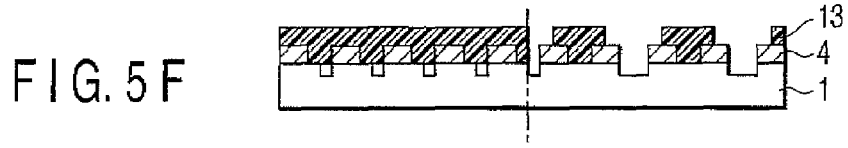

Next, as shown in FIG. 5F, a resist pattern 13 is formed on the shielding portions 4 and the quartz glass substrate 1. The resist pattern 13 forms second transmitting portions (phase grooved portions) in the alternating PSM region. The PSG region is masked by the resist pattern 13. The alternating PSM region excluding the grooved portions is masked by the resist pattern 13.

Figure 5G:

Next, as shown in FIG. 5G, the surface of the quartz glass substrate 1 is etched by the wet process using the resist pattern 13 as a mask, and the grooved portions in the alternating PSM region are expanded in the lateral and vertical directions. The grooved portions expanded in the lateral and vertical directions form second transmitting portions 6' in the alternating PSM region.

Figure 5H:
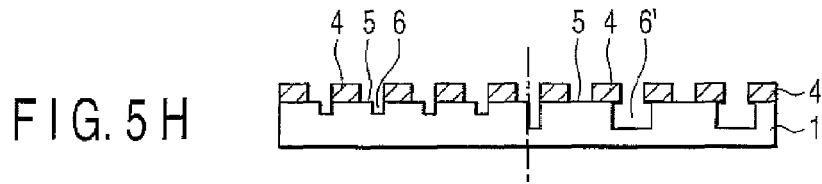

Thereafter, as shown in FIG. 5H, the resist pattern 13 is removed, and the exposure mask PM2 is obtained.

Figure 6:
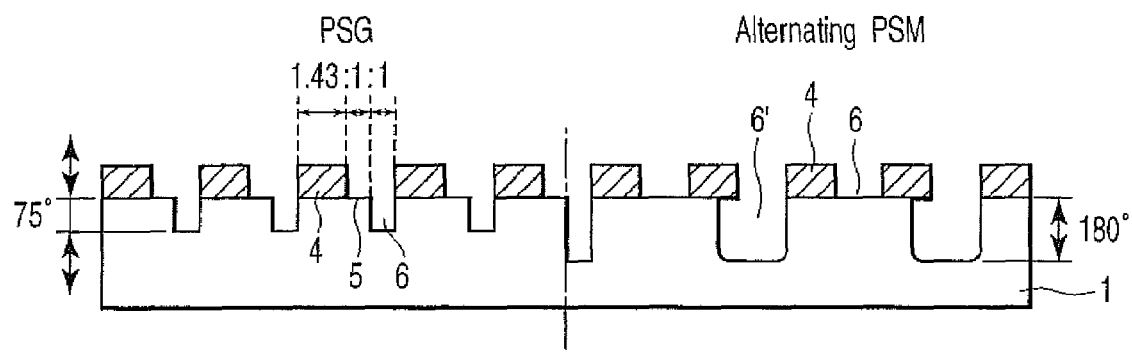
FIG. 6 is a sectional view showing the exposure mask of the embodiment.

FIG. 6 shows a sectional view of the exposure mask PM2 to which concrete dimensional values are attached.

A depth of the grooved portion of the second transmitting portion 6' is strictly controlled in such a manner that the absolute value of the difference between the phase of the light transmitted through the first transmitting portion 5 in the alternating PSM region and that of the light transmitted through the second transmitting portion 6' is 180°.

The depth of the grooved portion of the second transmitting portion 6' having a depth corresponding to 180° described above can be formed only by the RIE process without using any wet process. However, the grooved portion of the second transmitting portion 6' is formed using the RIE and wet processes for the following reasons.

Reaction products generated in the RIE process of FIG. 5E adhere to the side walls of the grooved portions. When the reaction products adhere to the side walls of the grooved portions, light transmission intensity of the grooved portion is reduced as compared with a non-grooved opening (surface portion of the quartz glass substrate 1 coated with the resist pattern 12). The reduction of the light transmission intensity of the grooved portion causes a dimensional error of the resist pattern formed on the wafer.

Then, after the RIE process, by performing the wet process, the reaction products adhering to the side walls of the grooved portions is removed and the grooved portion of the second transmitting portion 6' having the depth corresponding to 180° described above is formed.

A total etching amount in the RIE and wet processes needs to be set to an amount corresponding to 180° described above.

In this case, distribution of the etching amounts in a depth direction (vertical direction) in the RIE process and in a depth direction (vertical direction) in the wet process is determined in consideration of a side etching amount (etching amount in the lateral direction, required for removing the reaction products) required in the wet process.

Generally, an etching amount corresponding to 75° is selected in the RIE process of FIG. 5E, and an etching amount corresponding to 105° is selected in the wet process of FIG. 5E. In this case, the depth of the grooved portion of the second transmitting portion 6' in the PSG region is a depth corresponding to 75°.

In the case of W1:W2:W3=n:1:1, the condition that one of plus primary diffracted light and minus primary diffracted light turns to be vanished is represented by the following equation.

$$360°/(n+2)+\theta=180°$$ [Equation 3]

When $\theta=75°$ is substituted into [Equation 3], n=1.4286. A line width ratio (W1:W2:W3) of the PSG pattern is designed beforehand at 1.43:1:1.

That is, the line width ratio of the PSG pattern is selected in such a manner that the etching of the quartz glass substrate 1 for forming the PSG pattern is performed only by the RIE process without using any wet process. Therefore, a test mark having a high dimensional precision is manufactured.

Furthermore, the method of manufacturing the exposure mask PM2 of the present embodiment is the same as the conventional method of manufacturing an exposure mask except the pattern layout (shape and dimension of the pattern) on the quartz glass substrate 1.

Therefore, according to the present embodiment, it is possible to easily realize the exposure mask including the device pattern and the test mark having the high precision without incurring any increase of the manufacturing cost.

Moreover, when the device pattern is omitted from the exposure mask, it is possible to easily realize a focus test mark including high precision test mark without incurring any increase of manufacturing cost.

Figure 7:
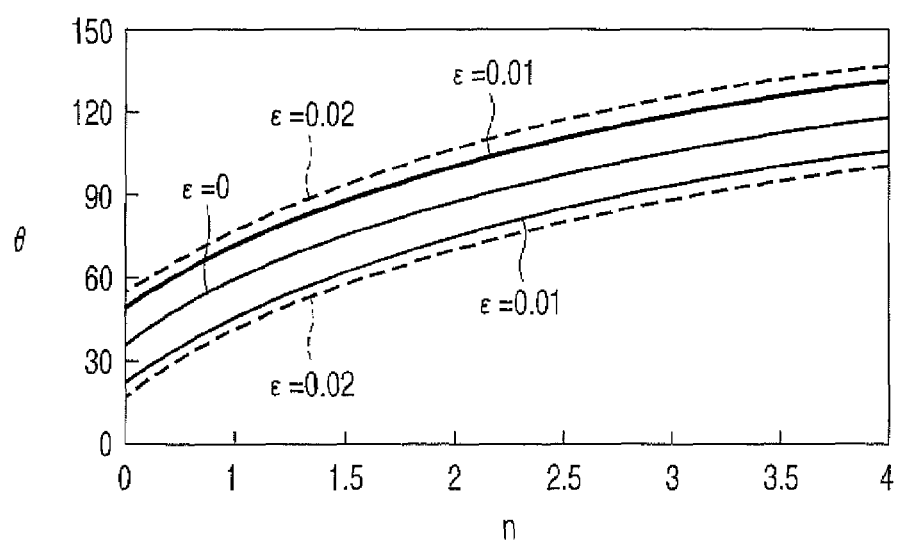
FIG. 7 is a diagram showing a relation between n and $\theta$.

FIG. 7 shows a relation between n and θ in the case of W1:W2:W3=n:1:1.

In FIG. 7, ϵ denotes a ratio (light intensity ratio) of an intensity of the plus primary diffracted light to that of the minus primary diffracted light. The primary diffracted light having a higher intensity is selected for a denominator of the light intensity ratio.

A thick solid line shows ϵ=0. A curve of ϵ=0 shows a relation between n and θ in a case where one primary diffracted light completely vanishes ϵ=0.01 (ideal condition).

On the other hand, two thin solid lines show ϵ=0.01. A curve of ϵ=0.01 shows a relation between n and θ in a case where one primary diffracted light has an intensity of about 1% of that of the other diffracted light.

Moreover, two dotted lines show ϵ=0.02. A curve of ϵ=0.02 shows a relation between n and θ in a case where one primary diffracted light has an intensity of about 2% of that of the other diffracted light. In a region held between these two dotted lines, focus measuring is sufficiently correctly performed. This region is represented by [Equation 2] described above.

Here, Table 1 shows a relation between n and θ (ideal value, effective range) in the case of ϵ=0.02.

TABLE 1

Figure 8A:
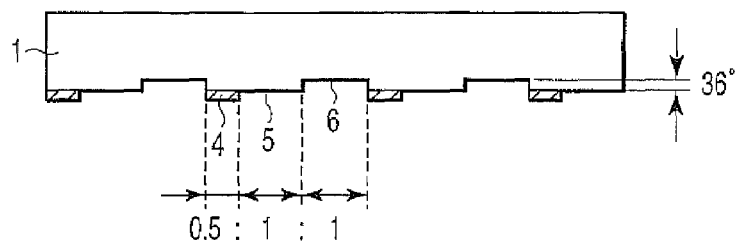
FIGS. 8A to 8F are sectional views of PSG patterns corresponding to n=0.5, 1.0, 1.5, 2.0, 2.5, 3.0.
Figure 8B:
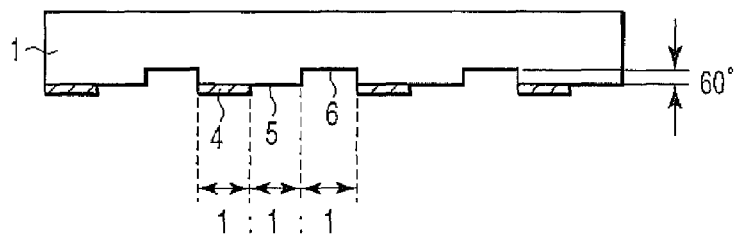
Figure 8C:
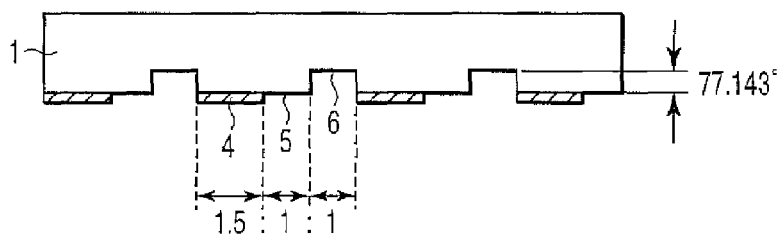
Figure 8D:
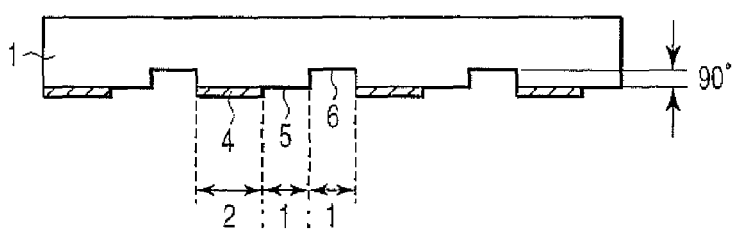
Figure 8E:
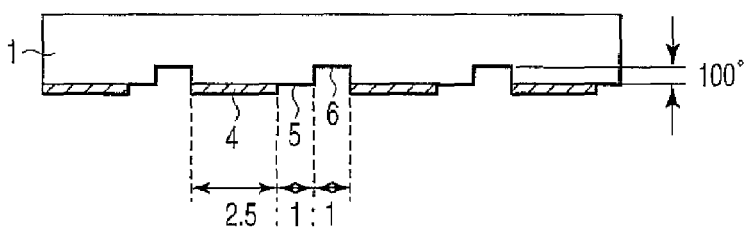
Figure 8F:
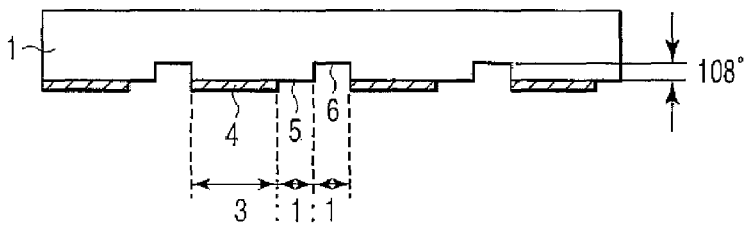

|  | n | θ Ideal value | Effective range |
| --- | --- | --- | --- |
| FIG. 8A | 0.5 | 36° | 19 to 53° |
| FIG. 8B | 1.0 | 60° | 43 to 77° |
| FIG. 8C | 1.5 | 77.143° | 60 to 94° |
| FIG. 8D | 2.0 | 90° | 73 to 107° |
| FIG. 8E | 2.5 | 100° | 83 to 117° |
| FIG. 8F | 3.0 | 108° | 91 to 125° |

As θ is closer to the ideal value, needless to say, a focus measurement precision becomes higher. However, when ease of designing of the mask is considered, n is preferably a definite number (round number). FIGS. 8A to 8F show sectional views of PSG patterns corresponding to n=0.5 (θ=36°), 1.0 (θ=60°), 1.5 (θ=77.143°), 2.0 (θ=90°), 2.5 (θ=100°), 3.0 (θ=108°). Especially, the mask of FIG. 8D is a mask comprising a structure described as one example in Jpn. Pat. No. 3297423. Masks having realistic θ and n are the masks shown in FIGS. 8A, 8B, and 8F.

The focus test mask PM1 of the present embodiment will be described further. As described above, the focus test mask PM1 of the present embodiment comprises the test mark TM and the reference pattern 3.

Figure 9A:
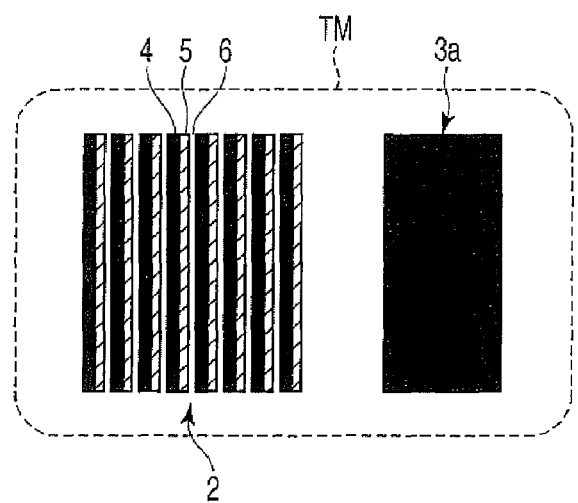
FIGS. 9A to 9C are plan views showing test marks including typical reference patterns.
Figure 9B:
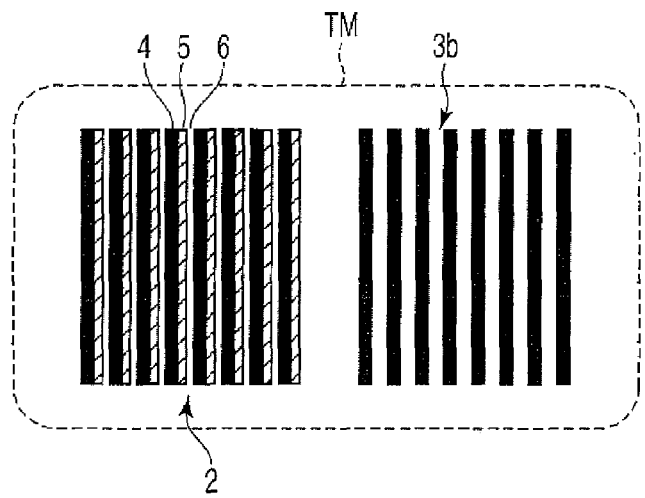
Figure 9C:
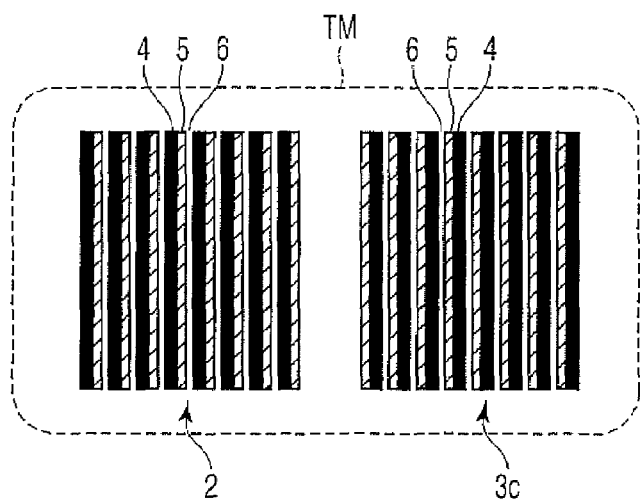
Figure 10A:
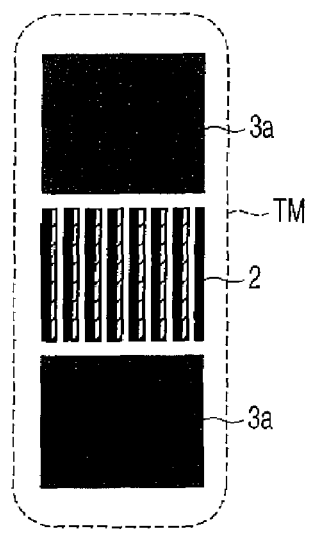
FIGS. 10A to 10C are plan views showing test marks capable of eliminating measurement errors attributed to a measuring apparatus.
Figure 10B:
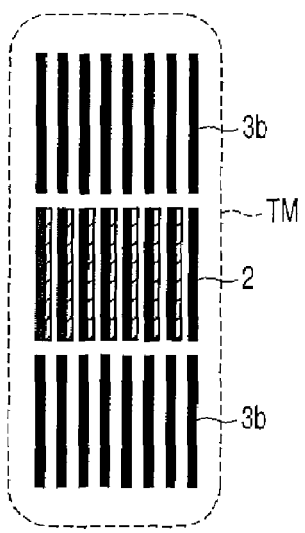
Figure 10C:
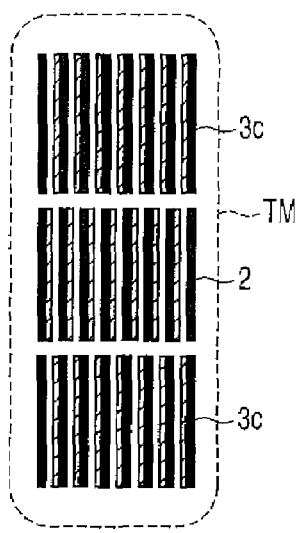
Figure 11A:
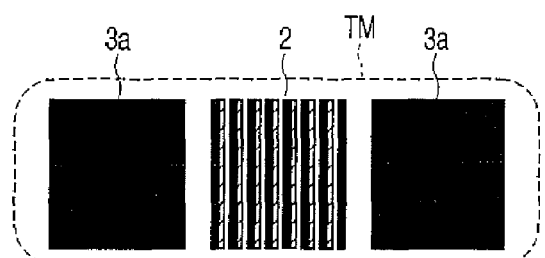
FIGS. 11A to 11C are plan views showing another test marks capable of eliminating the measurement errors attributed to the measuring apparatus.
Figure 11B:
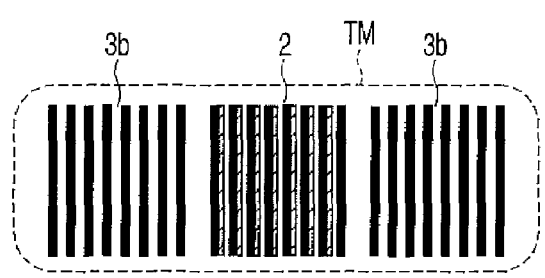
Figure 11C:
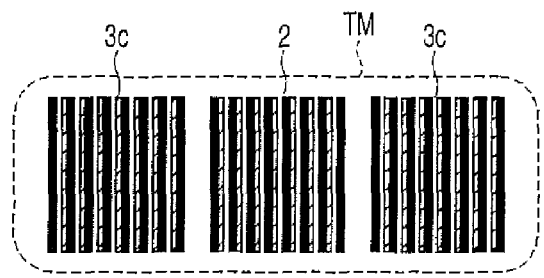

As the reference pattern 3, mainly there are three types shown in FIGS. 9A to 9C. That is, there are a large isolated pattern 3a shown in FIG. 9A, a diffraction grating pattern 3b shown in FIG. 9B, and an asymmetrical diffraction grating 3c whose direction is opposite to that of the PSG pattern 2 as shown in FIG. 9C.

Since the large isolated pattern 3a has a broad DOF, the measuring having a broad focus range is possible. Since an influence of coma aberration of the diffraction grating pattern 3b is equivalent to that of an asymmetrical diffraction grating, the measuring which is not influenced by the coma aberration is possible. Moreover, since a relative shift amount of the opposite directed asymmetrical diffraction grating 3c is double, the measuring having twice sensitivity is possible.

Moreover, to remove the measurement error attributed to the measuring apparatus, as shown in FIGS. 10A to 10C and 11A to 11C, it is preferable to use the test mark TM having a structure in which one PSG pattern 2 is put between two reference patterns (two large isolated patterns 3a, two diffraction grating patterns 3b, or two asymmetrical diffraction gratings 3c). Conversely, even when using a structure in which one reference pattern is put between two PSG patterns, similarly the measurement error attributed to the measuring apparatus can be removed. It is to be noted that in FIG. 10 and subsequent figures, patterns are not necessarily denoted with reference numerals for simplicity, and the same hatching shows the same portion.

Figure 12:
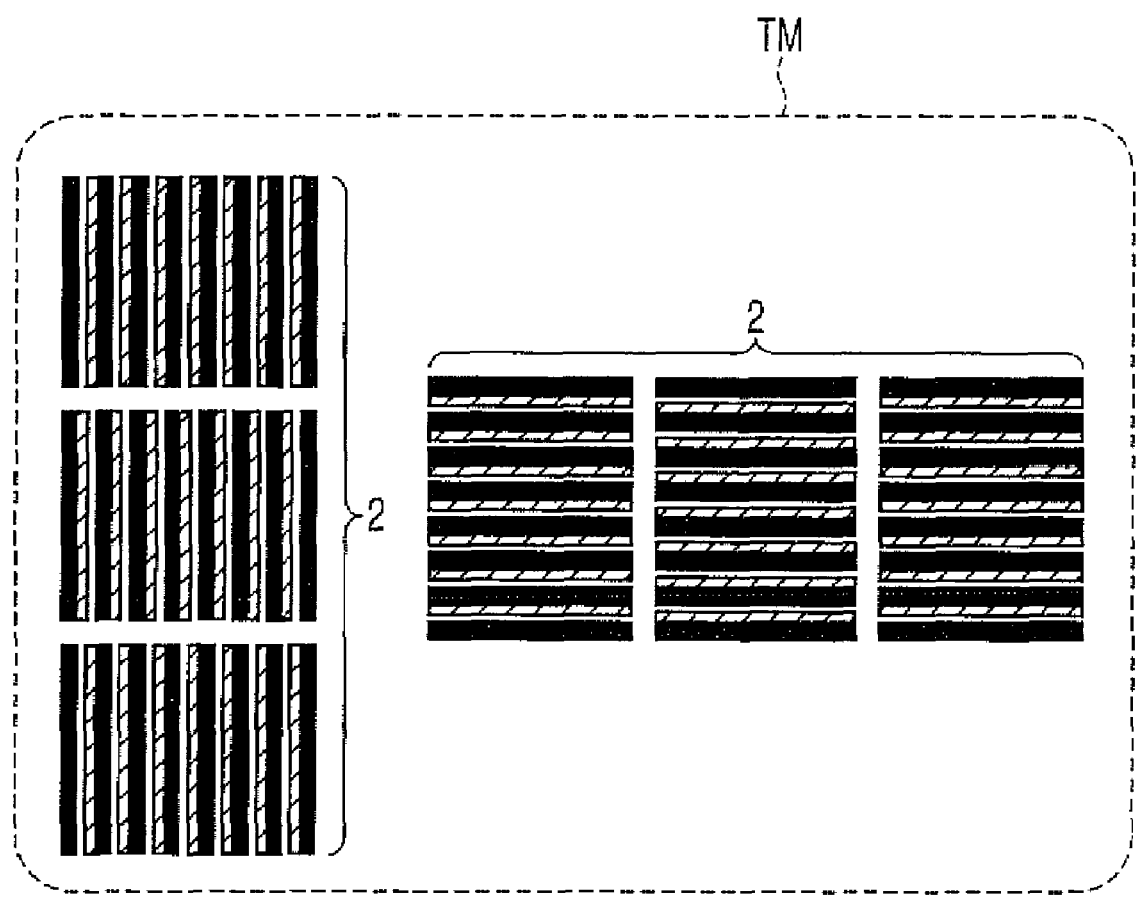
FIG. 12 is a plan view showing a test mark capable of measuring focus and astigmatism.

Furthermore, when astigmatism exists in a projection lens, as shown in FIG. 12, by the use of the test mark TM having a structure in which PSG patterns 2 in two directions crossing each other at right angles are disposed in the vicinity of each other, not only the focus but also the astigmatism can be measured.

FIG. 13 show plan views showing test marks corresponding to automatic measurements by an alignment shift inspection apparatus. FIG. 14 show sectional views along arrows A-A' and B-B' of FIG. 13D.

Figure 13A:
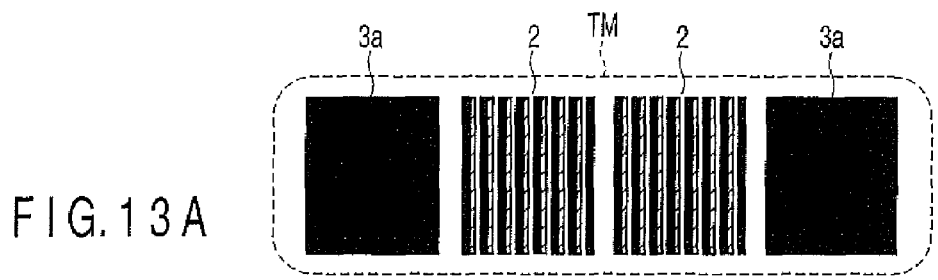
FIGS. 13A to 13D are plan views showing test marks corresponding to automatic measurements by an alignment shift inspection apparatus.
Figure 14A:
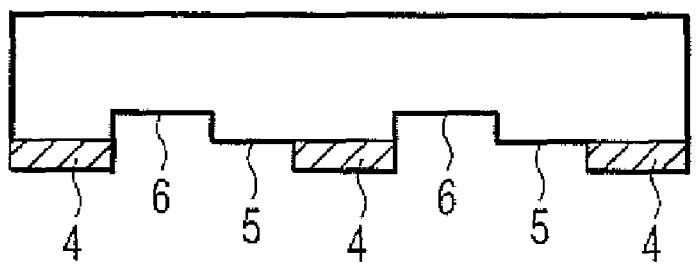
FIGS. 14A and 14B are sectional views along A-A' and B-B' of FIG. 13D.
Figure 14B:
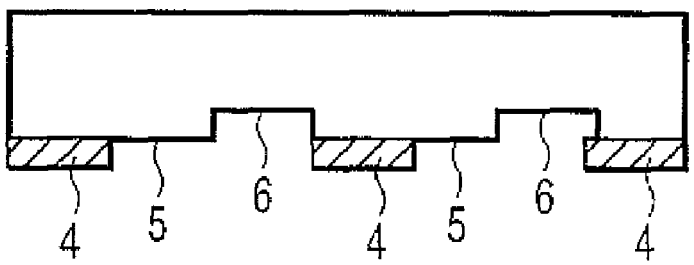

A test mark TM shown in FIG. 13A includes two asymmetrical diffraction grating patterns 2 (the first and second asymmetrical diffraction grating patterns), and two reference patterns (the first and second reference patterns) 3a.

Figure 13B:
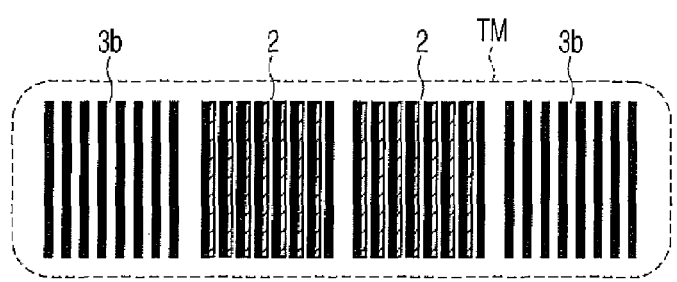

In a test mark TM shown in FIG. 13B, reference patterns 3a in the test mark TM shown in FIG. 13A is replaced with reference patterns 3b.

Figure 13C:
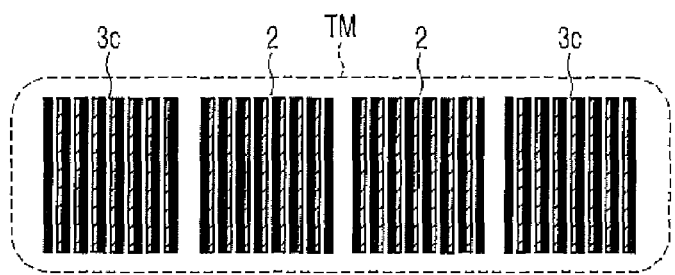

In a test mark TM shown in FIG. 13C, reference patterns 3a in the test mark TM shown in FIG. 13A is replaced with reference patterns 3c.

Figure 13D:
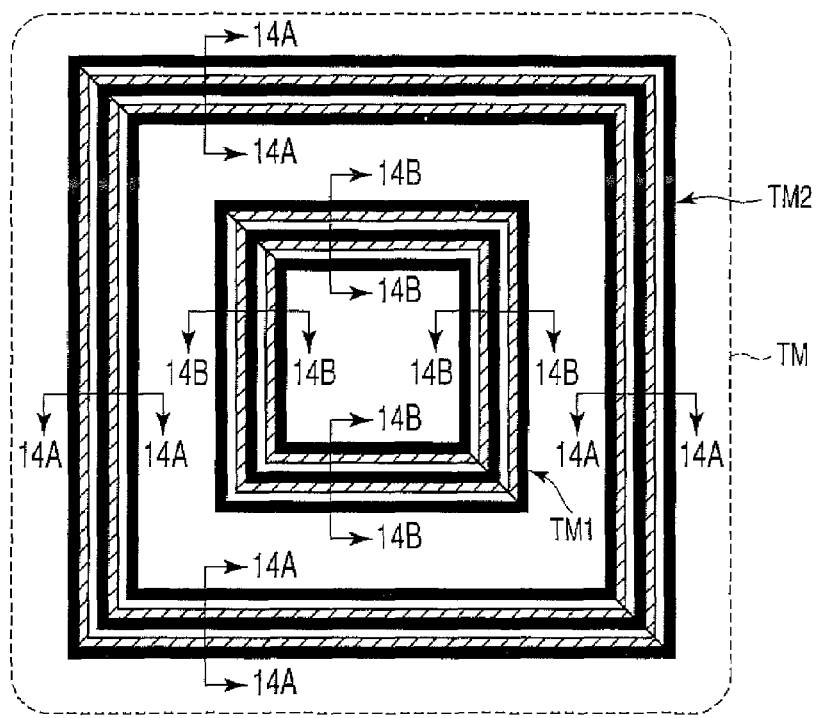

A test mark TM shown in FIG. 13D comprises a rectangular test mark TM1, and a rectangular test mark TM2 provided in such a manner as to surround the test mark TM1. The test marks TM1, TM2 are test marks obtained by changing a linear test mark obtained by vertically extending the test mark of one of FIGS. 13A to 13C into a rectangular shape.

That is, the test mark TM shown in FIG. 13D includes the first and second asymmetrical diffraction grating patterns and the first and second reference patterns, the first asymmetrical diffraction grating pattern and the first reference pattern are disposed in parallel on the first line, and the second asymmetrical diffraction grating pattern and the second reference pattern are disposed in parallel on the second line vertical to the first line.

In the test marks of FIGS. 13A to 13D, a relation between a focus value and a positional shift is not linear.

Figure 15A:
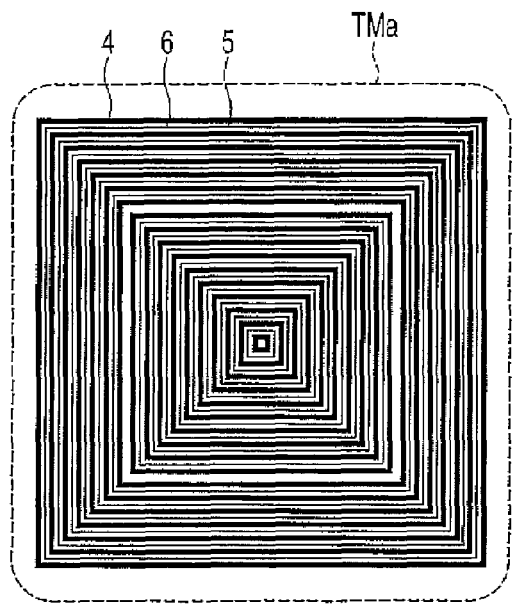
FIGS. 15A and 15B are plan views of test marks capable of linearizing a relation between a focus value and a positional shift.
Figure 15B:
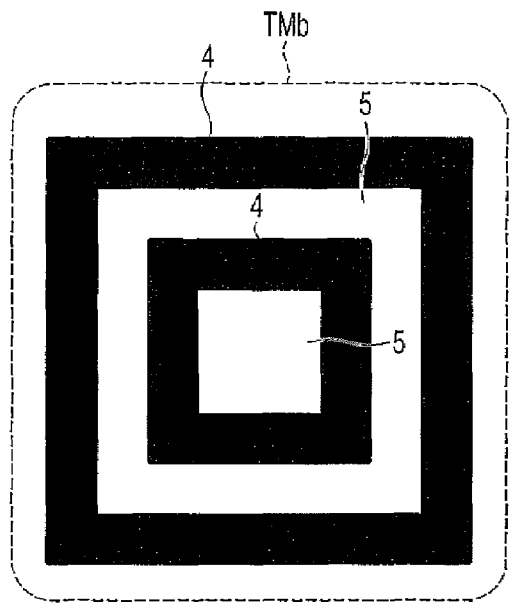

Examples of a test mark which improve the situation include test marks shown in FIGS. 15A and 15B. Exposure is performed using a test mark TMa shown in FIG. 15A, and thereafter the exposure is performed using a test mark TMb shown in FIG. 15B. Measurement patterns formed by these exposures have advantages that a relation between the focus value and the positional shift is substantially linear.

Figure 16:
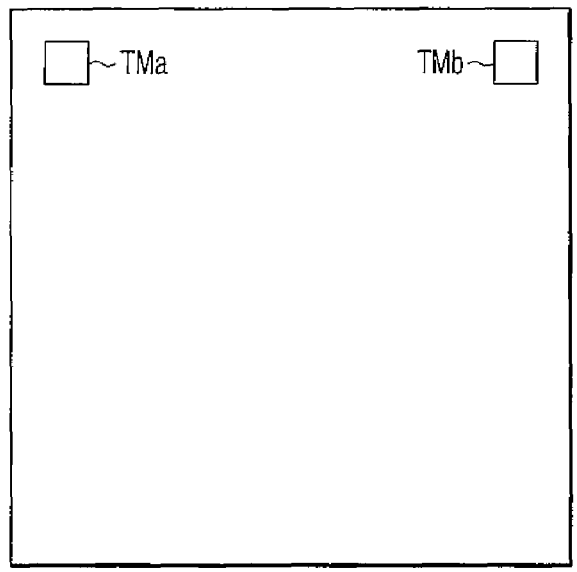
FIG. 16 is a plan view showing an exposure mask including the test mark of FIG. 15.

FIG. 16 is a plan view showing an exposure mask including the test marks TMa, TMb. The test marks TMa, TMb are arranged in a peripheral portion of an exposure region of an exposure mask.

Figure 17:
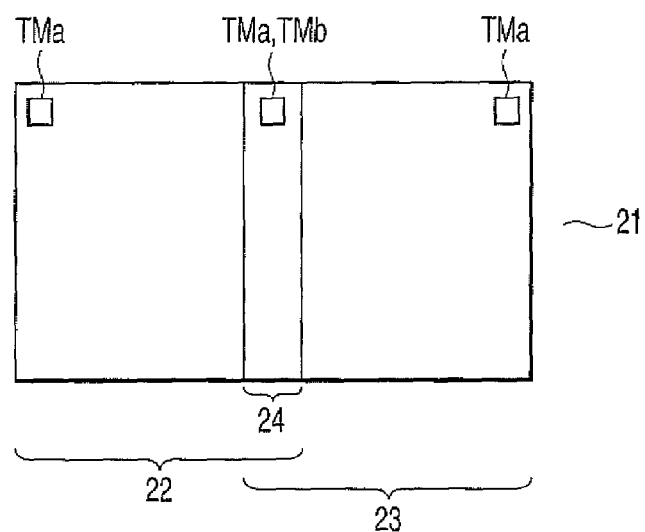
FIG. 17 is an explanatory view of a double exposure method using the exposure mask of FIG. 16.

FIG. 17 is an explanatory view of a double exposure method using the exposure mask of FIG. 16. In this method, the double exposure is performed utilizing an overlap region 24 of exposure regions 22, 23 adjacent to each other on a wafer 21.

That is, two exposure steps for two adjacent exposure regions 22, 23 are performed in such a manner that the pattern of the test mark TMa transferred in the exposure region 22 and the pattern of the test mark TMb transferred in the exposure region 23 overlap each other in a predetermined manner in the overlapped region 24. Accordingly, two exposure steps for performing the double exposure of the test marks do not have to be separately added.

Figure 18:
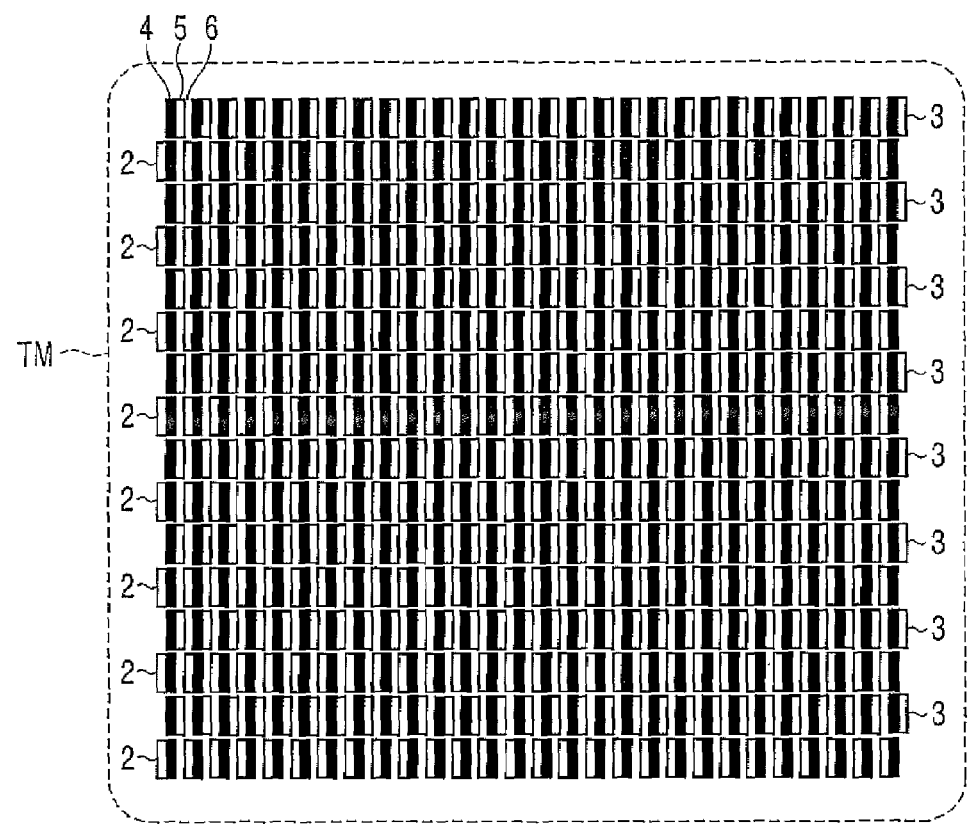
FIG. 18 shows a test mark for measuring a focus based on a profile of reflected light.

FIG. 18 shows a plan view of the test mark for measuring a focus based on a profile of reflected light.

The test mark of FIG. 18 includes a plurality of asymmetrical diffraction grating patterns 2 and a plurality of reference patterns 3. The asymmetrical diffraction grating patterns 2 and the reference patterns 3 are arranged in parallel on a line, and shifted in a lateral direction by a certain amount, while the asymmetrical diffraction grating patterns 2 and the reference patterns 3 are alternately arranged in a vertical direction.

In the configuration, since the patterns alternately shift in a vertical direction by the focus, the profile of the reflected light changes by interference by the shift. A focus value can be measured from the change of the profile. The profile of the reflected light can be acquired, for example, using a device referred to as a scatterometoroy. When the test mark of FIG. 18 is used, there is an advantage that the double exposure is not required.

A focus measuring method of the present embodiment is as follows.

In the focus measuring method of the present embodiment, a projection exposure apparatus is used which projects an image of a mask pattern formed on a photo mask onto a substrate via an optical projection system. The image of the test mark formed on the photo mask (focus test mask) of the present embodiment is projected onto the substrate using the projection exposure apparatus, and a defocus amount on the surface of the substrate is acquired using the image.

In further detail, at first, a photosensitive agent is applied on the substrate.

Next, images of the diffraction grating pattern and reference pattern in the test mark in the photo mask are exposed at the same time on the substrate.

Next, the pattern transferred onto the substrate is developed.

Next, a relative distance between the images of the diffraction grating pattern and the reference pattern formed on the substrate is measured, and the defocus amount is acquired based on the measured distance.

A method of manufacturing a semiconductor device of the present embodiment is as follows.

In the method of manufacturing the semiconductor device of the present embodiment, the projection exposure apparatus which projects the image of the mask pattern formed on the exposure mask onto the substrate via the optical projection system is used. The images of the device pattern and the test mark formed on the photo mask (exposure mask) of the embodiment are projected onto the substrate using the projection exposure apparatus, an actual semiconductor product is manufactured using the images, and the defocus amount of the surface of the substrate is acquired. Various combinations of the phase shift mask PSM of the exposure mask of the embodiment and the test mark TM are considered, and any combination may be used.

In further detail, at first, a photosensitive agent is applied on the substrate.

Next, the images of the asymmetrical diffraction grating pattern, reference pattern, and device pattern in the photo mask are exposed on the substrate at the same time.

Next, the pattern transferred on the substrate is developed.

Next, the device pattern formed on the substrate is inspected.

Next, when a defect is detected in the device pattern formed on the substrate in a step of inspecting the device pattern, the relative distance between the images of the diffraction grating pattern and the reference pattern is measured, and the defocus amount is acquired based on the measured distance.

Next, the device pattern in which the defect is detected, and the defocus amount are recorded in a memory device. A type of the memory device is not especially limited.

Next, the photo mask related to the device pattern in which the defect is detected is corrected.

Here, a case where the defocus amount is acquired when the defect is detected has been described, but the defocus amount may be acquired irrespective of presence of detection of the defect.

By constructing a database of a wafer history including the device pattern and the defocus amount, a cause for an inadvertently generated yield reduction can be easily investigated, and the reduction of the yield can be prevented beforehand.

Examples of the semiconductor device include a liquid crystal display (LCD) and devices using LCD (e.g., a cellular phone, liquid crystal television, personal computer, PDA) in addition to a DRAM, logic LSI, and system LSI (DRAM embedded LSI).

As described above, the photo mask in which the line width ratio of the shielding portion, transmitting portion, and phase grooved portion is 2:1:1 and a phase difference between the lights transmitted through the transmitting portion and the phase grooved portion is 90° is a most ideal photo mask for focus measuring. However, even by the use of the photo mask of the embodiment in which the phase difference and the line width ratio satisfy [Equation 2] instead of the above-described ideal photo mask, the high precision focus measuring substantially similar to that by the ideal photo mask is possible. Accordingly, for example, even when the asymmetrical diffraction grating is formed on a usual alternating type phase shift mask, a grooved amount can be set with respect to the phase difference having few loads on the mask manufacturing, and a high precision focus measuring technique equivalent to a conventional technique can be realized even in various exposure masks.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a photo mask having an alternating type phase shift mask (PSM) provided in a light-transmitting substrate, said PSM having a light-transmitting portion, and a focus test mask provided in said light-transmitting substrate, said focus test mask including an asymmetrical diffraction grating pattern in which diffraction efficiencies of plus primary diffracted light and minus primary diffracted light are different, the asymmetrical diffraction grating pattern including a shielding portion which shields light; a first transmitting portion which transmits light; and a second transmitting portion which transmits light, a ratio of widths of the shielding portion, the first transmitting portion, and the second transmitting portion being n:1:1, where n is a positive real number except 2, the asymmetrical diffraction grating pattern approximately satisfying $163° \leq 360°/(n+2)+\theta \leq 197°$ where $\theta$ ($\neq 90°$) indicates an absolute value of a difference between a phase of the light transmitted through the first transmitting portion and that of the light transmitted through the second transmitting portion; and a reference pattern configured to obtain an image as a reference for measuring a shift of an image of the asymmetrical diffraction grating pattern, the method comprising:

dry-etching the light-transmitting substrate to simultaneously form the second transmitting portion of the asymmetrical diffraction grating pattern and a groove of the PSM region; and wet-etching the groove of the PSM region to form the light-transmitting portion of the PSM.

2. The method according to claim 1, wherein the groove of the PSM region is expanded in directions of width and depth by the wet-etching.

3. A method of measuring focus using a photo mask manufactured by the method according to claim 1, comprising:

preparing the photo mask;

applying a photosensitive agent on the substrate;

exposing images of the asymmetrical diffraction grating pattern and the reference pattern in the photo mask at the same time onto the substrate;

developing a pattern transferred on the substrate; and measuring a relative distance between the images of the asymmetrical diffraction grating pattern and the reference pattern formed on the substrate.

4. The method according to claim 3, wherein the reference pattern is an asymmetrical diffraction grating pattern symmetrical to the asymmetrical diffraction grating pattern.

5. The method according to claim 3, wherein the reference pattern includes first and second reference patterns, and the asymmetrical diffraction grating pattern is disposed between the first and second reference patterns.

6. The method according to claim 3, wherein the asymmetrical diffraction grating pattern includes first and second asymmetrical diffraction grating patterns, and the reference pattern is disposed between the first and second asymmetrical diffraction grating patterns.

7. The method according to claim 3, wherein the asymmetrical diffraction grating pattern includes first and second asymmetrical diffraction grating patterns, the reference pattern includes first and second reference patterns, the first asymmetrical diffraction grating pattern and the first reference pattern are arranged in parallel on a first line, and the second asymmetrical diffraction grating pattern and the second reference pattern are arranged in parallel on a second line vertical to the first line.

8. The method according to claim 3, wherein the asymmetrical diffraction grating pattern includes a plurality of asymmetrical diffraction grating patterns, the reference pattern includes a plurality of reference patterns, and the plurality of asymmetrical diffraction grating pattern and plurality of the reference pattern are arranged in parallel on a line, and alternately arranged.

9. The method according to claim 3, wherein the $\theta$ and the n approximately satisfy $360°/(n+2)+\theta=180°$.

10. A method of manufacturing a semiconductor device using a photo mask manufactured by the method according to claim 1, comprising:

preparing the photo mask;

applying a photosensitive agent on the substrate;

exposing images of the asymmetrical diffraction grating pattern, the reference pattern, and the device pattern in the photo mask at the same time onto the substrate;

developing a pattern transferred on the substrate;

inspecting the device pattern formed on the substrate; and measuring a relative distance between the images of the asymmetrical diffraction grating pattern and the reference pattern in a case where a defect is detected in the device pattern in the inspecting the device pattern formed on the substrate.

\* \* \* \* \*

UNITED STATES PATENT AND TRADEMARK OFFICE
CERTIFICATE OF CORRECTION

PATENT NO. : 7,678,513 B2
APPLICATION NO. : 12/496585
DATED : March 16, 2010
INVENTOR(S) : Nomura It is certified that error appears in the above-identified patent and that said Letters Patent is hereby corrected as shown below:

Claim 8, column 12, line 17, change "grating pattern" to --grating patterns--.

Claim 8, column 12, lines 17-18, change "plurality of the reference pattern" to --the plurality of reference patterns--.

Signed and Sealed this

Fifteenth Day of June, 2010

David J. Kappos
*Director of the United States Patent and Trademark Office*